United States Patent [19]
Manning

[11] Patent Number: 5,275,965
[45] Date of Patent: Jan. 4, 1994

[54] TRENCH ISOLATION USING GATED SIDEWALLS

[75] Inventor: Monte Manning, Kuna, Id.

[73] Assignee: Micron Semiconductor, Inc., Boise, Id.

[21] Appl. No.: 981,631

[22] Filed: Nov. 25, 1992

[51] Int. Cl.$^5$ .................... H01L 21/28; H01L 21/311
[52] U.S. Cl. ........................................ 437/67; 437/61; 437/203
[58] Field of Search ............... 437/67, 203, 228, 61; 257/302, 330, 332

[56] References Cited

U.S. PATENT DOCUMENTS

| | | | |
|---|---|---|---|
| 4,295,924 | 10/1981 | Garnache | 257/330 |
| 4,673,962 | 6/1987 | Chatterjee et al. | 257/302 |
| 4,679,307 | 7/1987 | Bársony | 257/332 |
| 4,717,682 | 1/1988 | Taka et al. | 437/233 |
| 5,010,025 | 4/1991 | Solomon | 437/203 |

FOREIGN PATENT DOCUMENTS

| | | |
|---|---|---|
| 53-8076 | 1/1978 | Japan . |
| 61-140172 | 6/1986 | Japan . |
| 63-40362 | 2/1988 | Japan . |
| 63-250839 | 10/1988 | Japan . |
| 4-129222 | 4/1992 | Japan . |

Primary Examiner—George Fourson
Attorney, Agent, or Firm—David J. Paul

[57] ABSTRACT

The invention is directed to improving trench isolation between active devices by using gated sidewalls. In a first embodiment, trenches are etched into the substrate and a thin oxide film is formed to passivate the trench sidewalls and serve as a sidewall gate oxide. The oxide is removed from the bottom of the trench while leaving the sidewall oxide intact. A thin poly layer is formed into the trench so that the thin poly does not completely fill the trench, yet the thin poly film will overlie the oxide sidewalls and make contact to the exposed substrate at the bottom of the trench. The trench is then completely filled with a conformal oxide that is planarized. The planarized oxide is etched during thermal oxide etch and a sacrificial oxide is grown. Following threshold adjust implants, the sacrificial oxide is removed and the final gate sidewall oxide is formed. In a second embodiment, the process steps vary by leaving the thin oxide film at the bottom of the trench and then forming a thin poly film over the thin film oxide. The steps then continue as in the first embodiment and the thin poly in the trench is later tied to the substrate at points on the die external from the trench.

57 Claims, 7 Drawing Sheets

TRENCH ISOLATION USING GATED SIDEWALLS

FIELD OF THE INVENTION

This invention relates to semiconductor devices and more particularly to an metal oxide semiconductor (MOS) fabrication process to form self-aligned trench isolation between active devices having like conductivity types.

BACKGROUND OF THE INVENTION

As semiconductor devices continually progress towards denser packing of active devices, isolation between active devices having the same conductivity type, such as n-channel metal oxide semiconductors (NMOS) or p-channel metal oxide semiconductors (PMOS) used as field effect transistors, becomes an extremely important issue.

Less densely packed integrated circuits (ICs) could rely on isolation by a thick field oxide, scaling technology now, however demands less isolation space between active devices (i.e., adjacent NMOS transistors) than that required when using field oxide. In response to this demand, much of the MOS fabrication now uses trench isolation between active devices.

Typically, trench isolation comprises the etching of a trench into the substrate (i.e., silicon, gallium arsenide, etc.) thereby separating adjacent devices having like conductivity. The trench is then filled, usually with oxide.

One of the problems with trench isolation is preventing a step-down at the edge of the trench into the field regions. This step causes a resulting sidewall parasitic device (resident at the trench sidewall formed between the gate poly as it crosses onto the field oxide and the sidewall of the trench.) to turn on sooner than the bulk device (i.e., NMOS device) itself. Also, the gate oxidation over the step-down is thinner, thereby degrading the reliability of the gate oxide. Finally, doping of the sidewall of the trench to increase the Vt. of the parasitic sidewall device is difficult, in that it requires either high-angled implants or some type of in-diffusion from the poly or a furnace doping process of some kind.

SUMMARY OF THE INVENTION

The invention is directed to improving trench isolation between active devices by using gated sidewalls. The sidewalls of the isolation trenches are gated by a thin layer of polysilicon tied to the substrate in a self-aligned manner or alternately the oxide extends underneath the thin poly in the trench area and the poly is then tied to the substrate in some other location on the semiconductor die external from the trench area.

In a first embodiment, trenches are etched into the substrate and a thin oxide film is formed to passivate the trench sidewalls and serve as a sidewall gate oxide. The oxide is removed from the bottom of the trench while leaving the sidewall oxide intact. A thin poly layer is formed into the trench so that the thin poly does not completely fill the trench, yet the thin poly film will overlie the oxide sidewalls and make contact to the exposed substrate at the bottom of the trench. The trench is then completely filled with a conformal oxide that is planarized. The planarized oxide is etched during a thermal oxide etch and a sacrificial oxide is grown. Following implants the sacrificial oxide is removed and the final gate oxide is formed.

In a second embodiment, the process steps vary by leaving the thin oxide film at the bottom of the trench and then forming a thin poly film over the thin film oxide. The steps then continue as in the first embodiment and the thin poly in the trench is later tied to the substrate at locations on the die external from the trench.

DETAILED DESCRIPTION OF THE PREFERRED EMBODIMENT

The present invention is directed to a fabrication process for constructing self-aligned trench isolation between active devices having like conductivity types. Description of the steps used to form trench isolation using gated sidewalls, as shown in FIGS. 1-10, will now follow.

Figure 1:
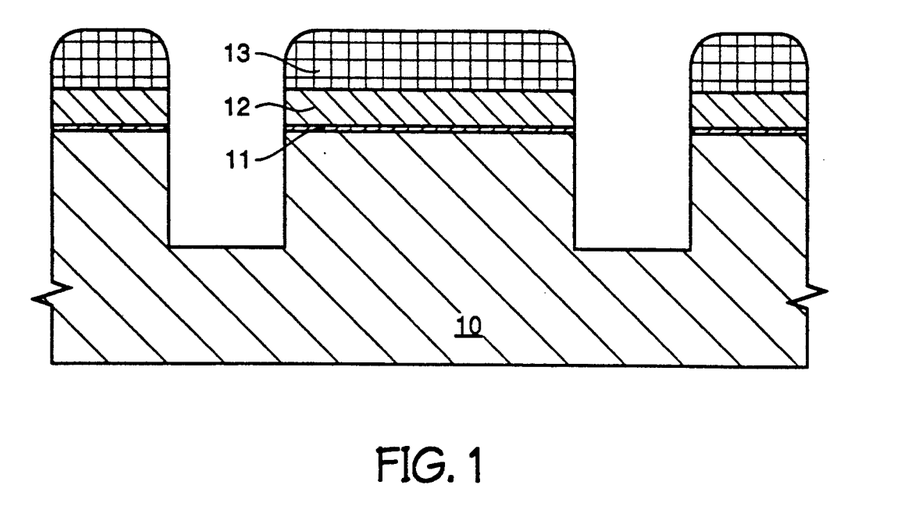
FIG. 1 shows a cross-sectional view of an in-process wafer portion having a substrate with trenches etched therein by using an oxide/nitride/oxide mask.

As shown in FIG. 1, a wafer is fabricated using conventional process steps, known to one skilled in the art, where trenches have been formed into wafer substrate 10, with the aid of the patterned masking of oxide 11, nitride 12 and phosphorus silicon glass (PSG) 13.

Figure 2:
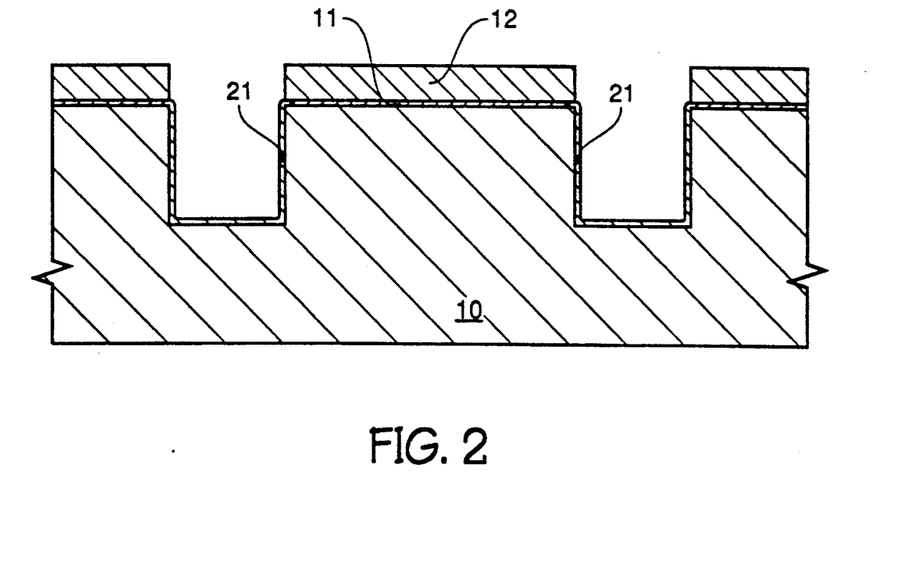
FIG. 2 shows a cross-sectional view of the in-process wafer portion of FIG. 1 after a thermal growth of a thin oxide film.

Referring now to FIG. 2, a thin layer of oxide 21, preferably 250 Å thick, is grown to passivate the trench sidewalls and to act as a sidewall gate oxide of an eventually formed parasitic transistor.

Figure 3:
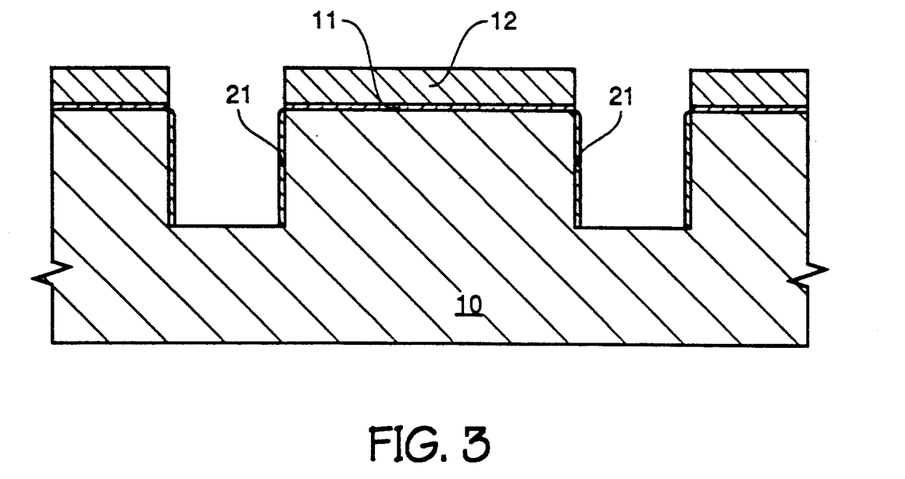
FIG. 3 shows a cross-sectional view of the in-process wafer portion of FIG. 2 after removal of the thermal oxide from the bottom of the trenches.

Referring now to FIG. 3, oxide 21 is removed from the bottom of the trench with an anisotropic etch. However, the trench sidewall oxide is unaffected except for thinning of the oxide at the upper corners of the trench where the pattered mask of nitride 12 overlies pad oxide 11. Alternately, this anisotropic etch step could be skipped to form the resultant structure depicted in FIG. 12, as will be discussed later.

Figure 4:
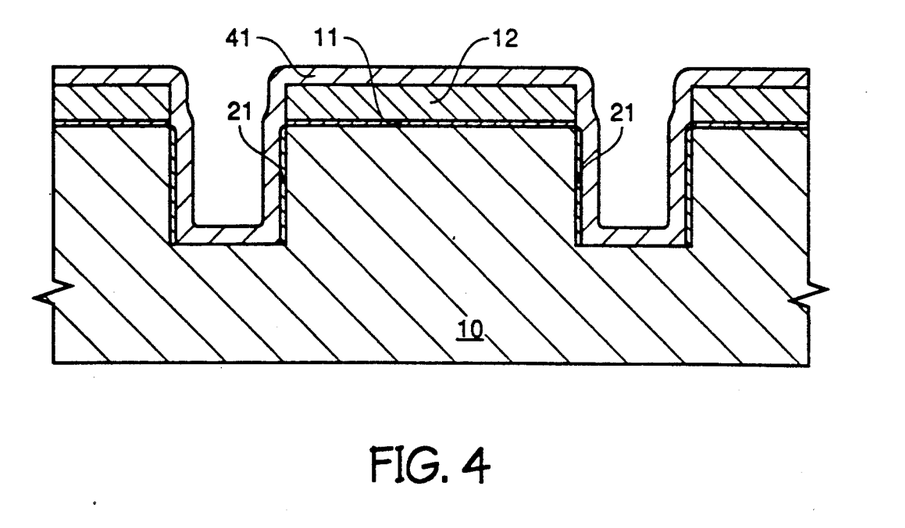
FIG. 4 shows a cross-sectional view of the in-process wafer portion of FIG. 3 after deposition of in-situ doped poly thereby making contact to the bottom of the trenches.

Referring now to FIG. 4, a layer of in-situ doped poly 41 is deposited. Poly 41 can be lightly doped to n-conductivity by a number of ways, but the preferred method would be by in-situ doping poly 41 with arsenic or phosphorous during deposition. If an p-channel device is to be formed then boron doping could be used. Poly 41 should be thin enough (500 Å is preferred) to avoid completely filling the trench since a trench completely filled with poly would cause high stress in later thermal cycles and possibly cause single crystal defects in the active areas resulting in high junction leakage currents and gate oxide integrity problems.

Figure 5:
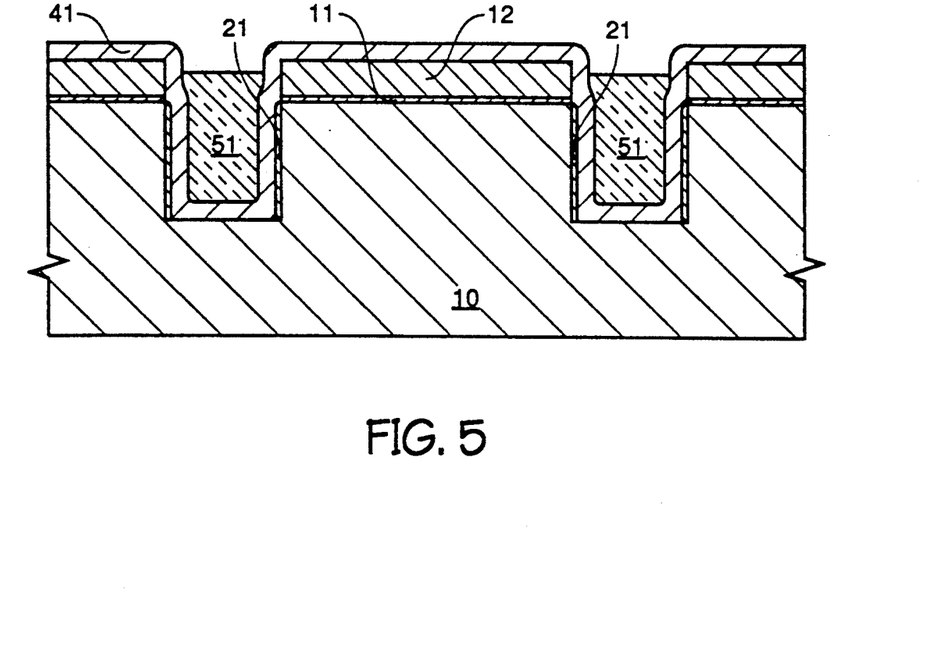
FIG. 5 shows a cross-sectional view of the in-process wafer portion of FIG. 4 after the trenches are filled with conformal oxide which is subsequently planarized.

Referring now to FIG. 5, the trench is filled with conformal oxide 51 which is then planarized to expose underlying poly 41. Any number of planarizing techniques may be used, such as chemical mechanical planarization, resist etchback, etc.

Figure 6:
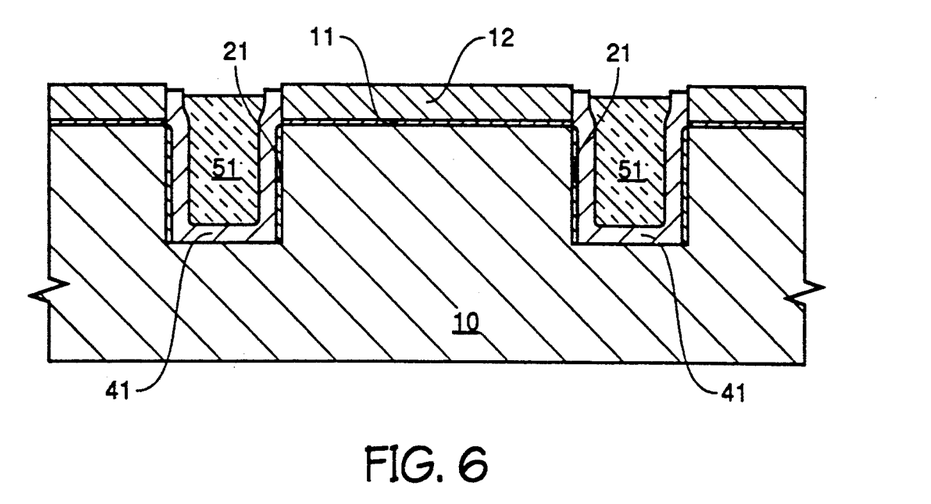
FIG. 6 shows a cross-sectional view of the in-process wafer portion of FIG. 5 after removal of exposed poly.

Referring now to FIG. 6, the exposed portions of poly 41 is removed, preferably leaving a portion of poly 41 extending above planarized oxide 51.

Figure 7:
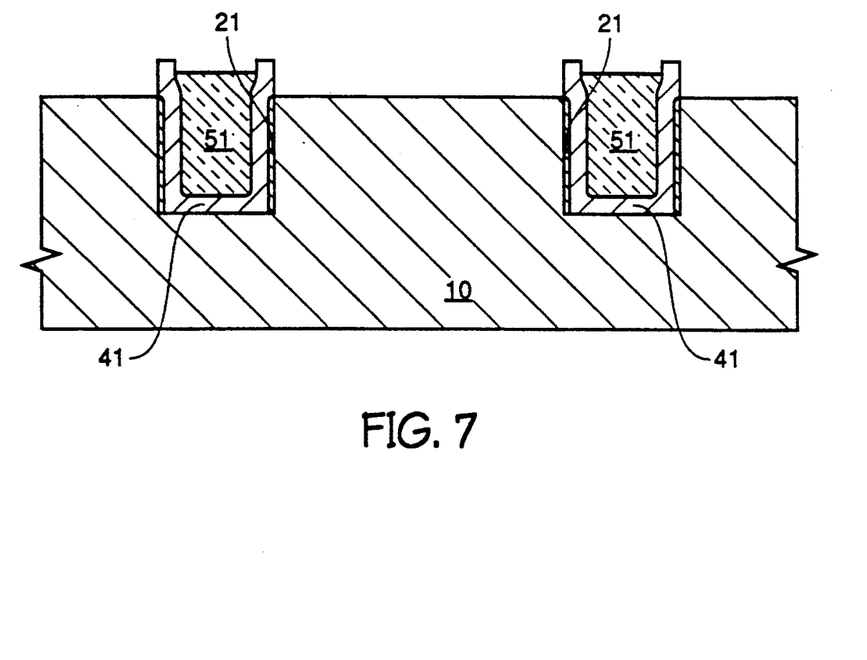
FIG. 7 shows a cross-sectional view of the in-process wafer portion of FIG. 6 after removal of the nitride and pad oxide.

Referring now to FIG. 7, nitride 12 is removed followed by the removal of the underlying pad oxide 11. During removal of pad oxide 11, the upper portion of the trench sidewall oxide 11 is etched and the planarized oxide 51 is also etched, but at a much faster rate. However, the etching of both the trench sidewall oxide and the planarized oxide does not pose a problem as will be explained in the subsequent steps.

Figure 8:
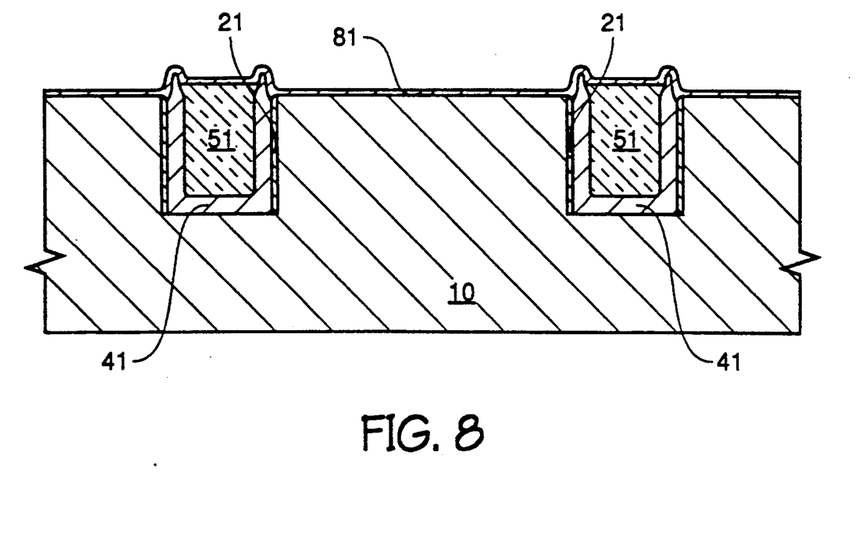
FIG. 8 shows a cross-sectional view of an in-process wafer portion of FIG. 7 after the growth of a sacrificial oxide.

Referring now to FIG. 8, sacrificial oxide 81 is grown which replaces any trench sidewall oxide that was removed in the previous step. Further, the fully exposed poly tip will be consumed from both sides thereby reducing the height at which the tips protrude above substrate 10. At this point, threshold adjust implants are performed. Alternately, the step of growing sacrificial oxide 81 could be skipped and the threshold adjust implants could be preformed through the original pad oxide after nitride 12 has been stripped.

Figure 9:
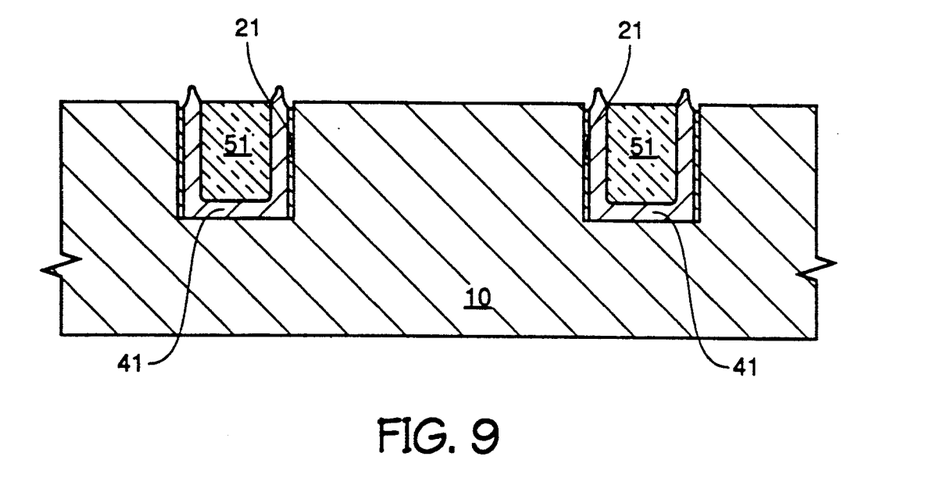
FIG. 9 shows a cross-sectional view of an in-process wafer portion of FIG. 8 after dopant implantations and removal of the sacrificial oxide.
Figure 10:
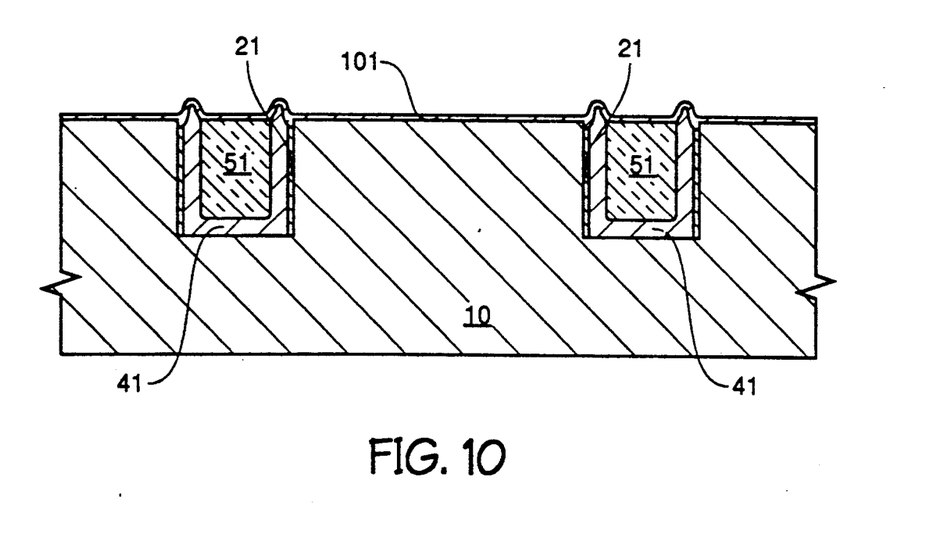
FIG. 10 shows a cross-sectional view of an in-process wafer portion of FIG. 9 after the final gate oxidation is grown.

Referring now to FIGS. 9 and 10, sacrificial oxide 81 (seen in FIG. 8) is removed and device gate oxide 101 is grown, respectively. As was true for the sacrificial oxide, the growth of gate oxide 101 will replace any trench sidewall oxide removed in the past oxide etch since both the trench edge and the poly will become reoxidized. Further, since the sidewall poly is heavily doped, the gate oxide 101 will grow more oxide on the poly tips thus further preventing dielectric breakdown from the device gate poly. Finally, since the sidewall poly is tied to the substrate and if this substrate is negatively biased with respect to the source of the device (n-channel), then the sidewall device will be biased to a "hard-off" condition, thus preventing parasitic turn-on of the sidewall device.

Figure 11:
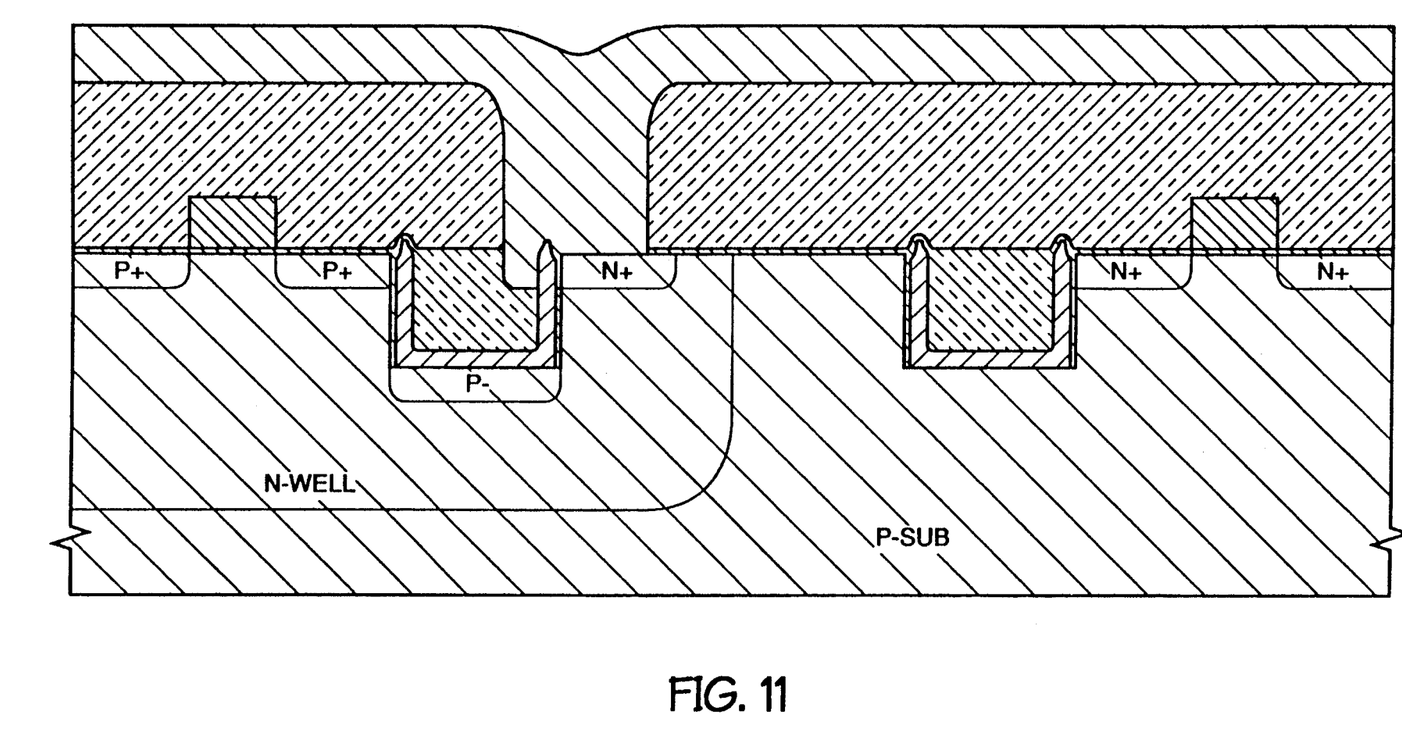
FIG. 11 shows a cross-sectional view of an in-process wafer portion of FIG. 10 demonstrating isolation between sidewall poly in n-wells from that in p-wells.

P-channel devices, which also have the sidewalls gated with P+ poly are not as susceptible to the sidewall device problems that n-channel devices are. Still, care must be taken during layout to isolate the sidewall poly in n-wells from that in p-wells. As shown in FIG. 11, using a guard band between the p-channel and n-channel devices will accomplish this task. Also, if the well ties are overlapped off the edge of the trench, they will also make contact to the sidewall gate poly, thus preventing any problems from the reverse biased diode at the bottom of the n-well trench which is caused by out diffusion of the dopant (boron in this case) from the sidewall gate poly. FIG. 11 shows the use of the present invention for both an n-channel device and an adjacent p-channel device.

Figure 12:
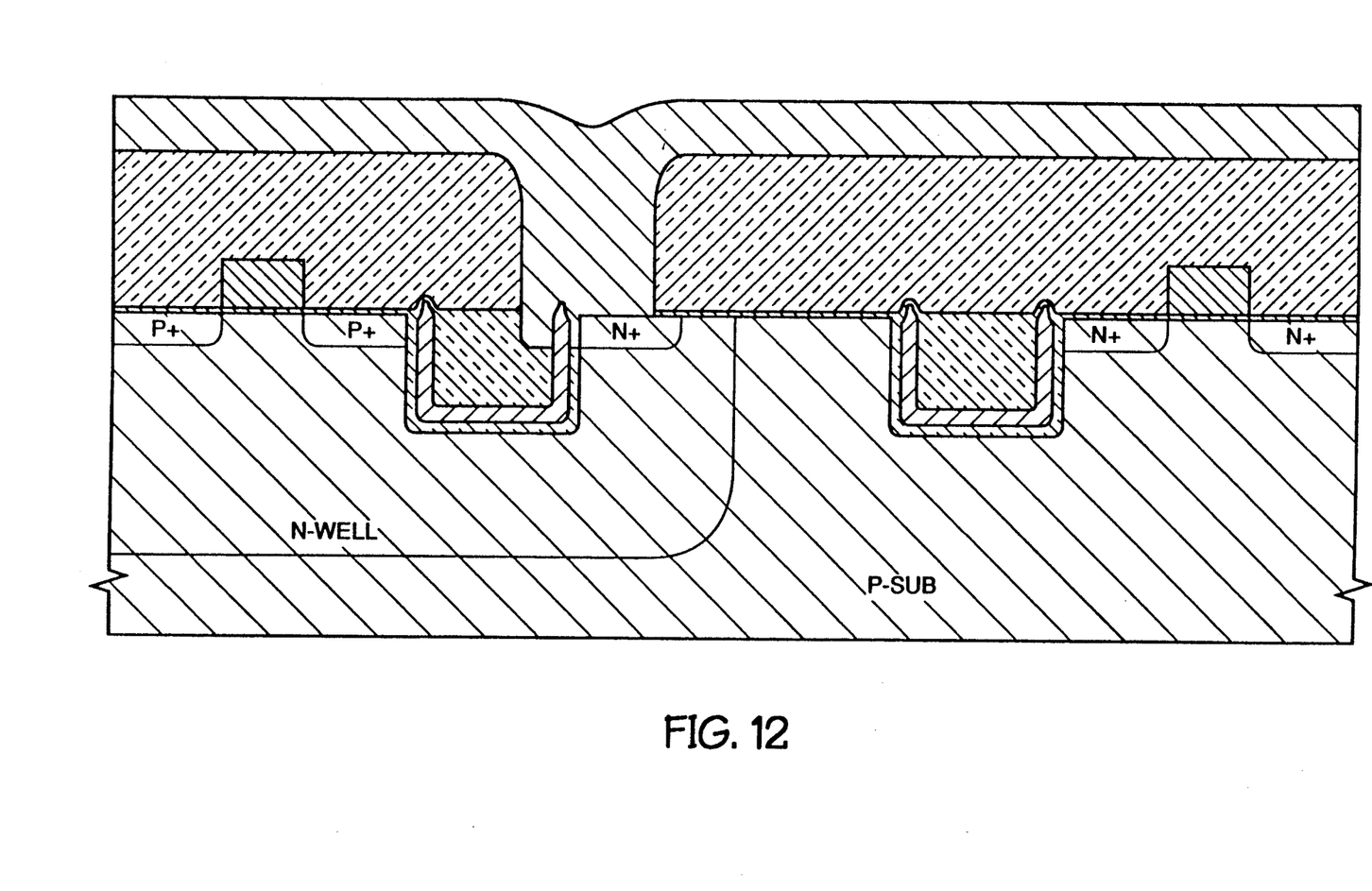
FIG. 12 shows a resultant structure similar to that of FIG. 11 when the removal of the thermal oxide from the bottom of the trenches, shown in FIG. 2, is skipped.

FIG. 12 shows the use of the present invention for both an n-channel device and an adjacent p-channel device with the exception that the step for removal of the thin oxide in the bottom of the trench (step depicted in FIG. 3) is skipped. With the presence of oxide 11 in the bottom of the trench, poly 41 is separated from substrate 10. This separation requires tying substrate 10 to poly 41 on a portion of the die which is external from the trench area.

It is to be understood that although the present invention has been described with reference to a preferred embodiment, various modifications, known to those skilled in the art, such as employing the present invention into any integrated circuit using active NMOS and/or PMOS devices, may be made to the structure and process steps presented herein without departing from the invention as recited in the several claims appended hereto.

I claim:

1. A process for forming self aligned gated sidewall trench isolation between active devices in a semiconductor device fabricated on a starting substrate, said process comprising:
   a) forming trenches into said starting substrate, said starting substrate being masked with patterned insulating layers;
   b) forming a conformal insulating layer to the sidewalls and bottom of said trench;
   c) removing said conformal insulating layer from said bottom of said trench;
   d) forming a conductive material layer over the sidewalls and bottom of said trench;
   e) forming a planarized insulating layer inside said trench while exposing portions of said conductive layer;
   f) removing said exposed portions of the conductive layer;
   g) removing said patterned insulating layers thereby exposing portions of said starting substrate and exposing the upper ends of said conductive layer;
   h) forming a sacrificial insulating layer over said exposed substrate portions and said conductive layer's exposed upper ends;
   i) conductively doping said starting substrate;
   j) removing said sacrificial insulating layer; and
   k) forming a gate insulating layer over said starting substrate for said active devices.

2. The process as recited in claim 1, wherein said starting substrate is silicon.

3. The process as recited in claim 1, wherein said conformal insulating layer, said planarized insulating layer, said sacrificial insulating layer, and said gate insulating layer are oxides.

4. The process as recited in claim 1, wherein said conductive layer is in-situ doped polysilicon.

5. The process as recited in claim 4, wherein said polysilicon is doped to a n-type conductivity.

6. The process as recited in claim 4, wherein said polysilicon is doped to a p-type conductivity.

7. The process as recited in claim 5, wherein said polysilicon is doped by phosphorous.

8. The process as recited in claim 5, wherein said polysilicon is doped by arsenic.

9. The process as recited in claim 6, wherein said polysilicon is doped by boron.

10. The process as recited in claim 7, wherein said conformal oxide is approximately 250 Å thick.

11. The process as recited in claim 4, wherein said polysilicon is approximately 500 Å thick.

12. A process for forming self aligned gated sidewall trench isolation between active devices in a semiconductor device fabricated on a starting silicon substrate, said process comprising:
 a) forming trenches into said starting silicon substrate, said starting silicon substrate being masked with patterned nitride and oxide layers;
 b) forming a conformal oxide layer to the sidewalls and bottom of said trench;
 c) removing said conformal oxide layer from said bottom of said trench;
 d) forming a conductively doped polysilicon layer over the sidewalls and bottom of said trench;
 e) forming a planarized oxide layer inside said trench while exposing portions of said conductively doped polysilicon layer;
 f) removing said exposed portions of the conductively doped polysilicon layer;
 g) removing said patterned nitride and oxide layers thereby exposing portions of said starting silicon substrate and exposing the upper ends of said conductively doped polysilicon layer;
 h) forming a sacrificial oxide layer over said exposed starting silicon substrate portions and said conductively doped polysilicon layer's exposed upper ends;
 i) conductively doping said starting silicon substrate;
 j) removing said sacrificial oxide layer; and
 k) forming a gate oxide layer over said starting silicon substrate for said active devices.

13. The process as recited in claim 12, wherein said conductively doped polysilicon layer is in-situ doped to a n-type conductivity.

14. The process as recited in claim 12, wherein said conductively doped polysilicon layer is in-situ doped to a p-type conductivity.

15. The process as recited in claim 13, wherein said polysilicon is doped by phosphorous.

16. The process as recited in claim 13, wherein said polysilicon is doped by arsenic.

17. The process as recited in claim 14, wherein said polysilicon is doped by boron.

18. The process as recited in claim 12, wherein said conformal oxide is approximately 250 Å thick.

19. The process as recited in claim 12, wherein said conductively doped polysilicon is approximately 500 Å thick.

20. A process for forming self aligned gated sidewall trench isolation between active devices in a semiconductor device fabricated on a starting substrate, said process comprising:
 a) forming trenches into said starting substrate, said starting substrate being masked with patterned insulating layers;
 b) forming a conformal insulating layer to the sidewalls and bottom of said trench;
 c) forming a conductive material layer over the sidewalls and bottom of said trench;
 d) forming a planarized insulating layer inside said trench while exposing portions of said conductive layer;
 e) removing said exposed portions of the conductive layer;
 f) removing said patterned insulating layers thereby exposing portions of said starting substrate and exposing the upper ends of said conductive layer;
 g) forming a sacrificial insulating layer over said exposed substrate portions and said conductive layer's exposed upper ends;
 h) conductively doping said starting substrate;
 i) removing said sacrificial insulating layer; and
 j) forming a gate insulating layer over said starting substrate for said active devices.

21. The process as recited in claim 20, wherein said starting substrate is silicon.

22. The process as recited in claim 20, wherein said conformal insulating layer, said planarized insulating layer, said sacrificial insulating layer, and said gate insulating layer are oxides.

23. The process as recited in claim 20, wherein said conductive layer is in-situ doped polysilicon.

24. The process as recited in claim 23, wherein said polysilicon is doped to a n-type conductivity.

25. The process as recited in claim 23, wherein said polysilicon is doped to a p-type conductivity.

26. The process as recited in claim 24, wherein said polysilicon is doped by phosphorous.

27. The process as recited in claim 24, wherein said polysilicon is doped by arsenic.

28. The process as recited in claim 25, wherein said polysilicon is doped by boron.

29. The process as recited in claim 20, wherein said conformal insulating layer comprises an oxide layer which is approximately 250 Å thick.

30. The process as recited in claim 23, wherein said polysilicon is approximately 500 Å thick.

31. A process for forming self aligned gated sidewall trench isolation between active devices in a semiconductor device fabricated on a starting substrate, said process comprising:
 a) forming trenches into said starting substrate, said starting substrate being masked with patterned insulating layers;
 b) forming a conformal insulating layer to the sidewalls and bottom of said trench;
 c) forming a conductive material layer over the sidewalls and bottom of said trench;
 d) forming a planarized insulating layer inside said trench while exposing portions of said conductive layer;
 e) removing said exposed portions of the conductive layer;
 f) removing said patterned insulating layers thereby exposing portions of said starting substrate and exposing the upper ends of said conductive layer;
 g) conductively doping said starting substrate.

32. The process as recited in claim 31, wherein threshold adjust implants are performed through said conformal insulating layer.

33. The process as recited in claim 31, wherein said starting substrate is silicon.

34. The process as recited in claim 31, wherein said conformal insulating layer and said planarized insulating layer are oxides.

35. The process as recited in claim 31, wherein said conductive layer is in-situ doped polysilicon.

36. The process as recited in claim 35, wherein said polysilicon is doped to a n-type conductivity.

37. The process as recited in claim 35, wherein said polysilicon is doped to a p-type conductivity.

38. The process as recited in claim 36, wherein said polysilicon is doped by phosphorous.

39. The process as recited in claim 36, wherein said polysilicon is doped by arsenic.

40. The process as recited in claim 37, wherein said polysilicon is doped by boron.

41. The process as recited in claim 31, wherein said conformal insulating layer comprises an oxide layer which is approximately 250 Å thick.

42. The process as recited in claim 35, wherein said polysilicon is approximately 500 Å thick.

43. A process for forming self aligned gated sidewall trench isolation between active devices in a semiconductor device fabricated on a starting silicon substrate, said process comprising:
   a) forming trenches into said starting silicon substrate, said starting silicon substrate being masked with patterned nitride and oxide layers;
   b) forming a conformal oxide layer to the sidewalls and bottom of said trench;
   c) forming a conductively doped polysilicon layer over the sidewalls and bottom of said trench;
   d) forming a planarized oxide layer inside said trench while exposing portions of said conductively doped polysilicon layer;
   e) removing said exposed portions of the conductively doped polysilicon layer;
   f) removing said patterned nitride and oxide layers thereby exposing portions of said starting silicon substrate and exposing the upper ends of said conductively doped polysilicon layer;
   g) forming a sacrificial oxide layer over said exposed starting silicon substrate portions and said conductively doped polysilicon layer's exposed upper ends;
   h) conductively doping said starting silicon substrate;
   i) removing said sacrificial oxide layer; and
   j) forming a gate oxide layer over said starting silicon substrate for said active devices.

44. The process as recited in claim 43, wherein said conductively doped polysilicon layer is in-situ doped to a n-type conductivity.

45. The process as recited in claim 43, wherein said conductively doped polysilicon layer is in-situ doped to a p-type conductivity.

46. The process as recited in claim 44, wherein said polysilicon is doped by phosphorous.

47. The process as recited in claim 44, wherein said polysilicon is doped by arsenic.

48. The process as recited in claim 45, wherein said polysilicon is doped by boron.

49. The process as recited in claim 43, wherein said conformal oxide layer is approximately 250 Å thick.

50. A process for forming self aligned gated sidewall trench isolation between active devices in a semiconductor device fabricated on a starting silicon substrate, said process comprising:
   a) forming trenches into said starting silicon substrate, said starting silicon substrate being masked with patterned nitride and oxide layers;
   b) forming a conformal oxide layer to the sidewalls and bottom of said trench;
   c) forming a conductively doped polysilicon layer over the sidewalls and bottom of said trench;
   d) forming a planarized oxide layer inside said trench while exposing portions of said conductively doped polysilicon layer;
   e) removing said exposed portions of the conductively doped polysilicon layer;
   f) removing said patterned nitride and oxide layers thereby exposing portions of said starting silicon substrate and exposing the upper ends of said conductively doped polysilicon layer;
   g) conductively doping said starting silicon substrate.

51. The process as recited in claim 50, wherein threshold adjust implants are performed through said conformal oxide layer.

52. The process as recited in claim 50, wherein said conductively doped polysilicon layer is in-situ doped to a n-type conductivity.

53. The process as recited in claim 50, wherein said conductively doped polysilicon layer is in-situ doped to a p-type conductivity.

54. The process as recited in claim 52, wherein said polysilicon is doped by phosphorous.

55. The process as recited in claim 52, wherein said polysilicon is doped by arsenic.

56. The process as recited in claim 53, wherein said polysilicon is doped by boron.

57. The process as recited in claim 50, wherein said conformal oxide is approximately 250 Å thick.

* * * * *